(12) United States Patent
Henseler et al.

(10) Patent No.: US 8,969,814 B2
(45) Date of Patent: Mar. 3, 2015

(54) SYSTEM AND METHOD OF DETERMINING TIMING TRIGGERS FOR DETECTING GAMMA EVENTS FOR NUCLEAR IMAGING

(75) Inventors: Debora Henseler, Erlangen (DE); Peter Hansen, Knoxville, TN (US); Meinrad Schienle, Ottobrunn (DE)

(73) Assignees: Siemens Medical Solutions USA, Inc., Malvern, PA (US); Siemens Aktiengesellschaft, Munich (DE)

( * ) Notice: Subject to any disclaimer, the term of this patent is extended or adjusted under 35 U.S.C. 154(b) by 30 days.

(21) Appl. No.: 13/589,350

(22) Filed: Aug. 20, 2012

(65) Prior Publication Data

US 2014/0048711 A1 Feb. 20, 2014

(51) Int. Cl.
*G01T 1/20* (2006.01)
*G01T 1/164* (2006.01)

(52) U.S. Cl.
CPC ........................................ *G01T 1/164* (2013.01)
USPC ........................................................ 250/362

(58) Field of Classification Search
USPC ........................................................ 250/362
See application file for complete search history.

(56) References Cited

U.S. PATENT DOCUMENTS

| | | | | |
|---|---|---|---|---|
| 8,080,780 B2 * | 12/2011 | Burr et al. | .................... | 250/252.1 |
| 2005/0109958 A1 * | 5/2005 | Vernon | .......................... | 250/526 |
| 2006/0231777 A1 * | 10/2006 | Vernon | .......................... | 250/526 |
| 2010/0294944 A1 * | 11/2010 | Furumiya et al. | ........... | 250/370.1 |
| 2011/0147567 A1 * | 6/2011 | Grazioso et al. | ............ | 250/208.1 |
| 2011/0155898 A1 * | 6/2011 | Burr et al. | .................... | 250/252.1 |
| 2011/0278466 A1 * | 11/2011 | Frach et al. | ............... | 250/370.11 |
| 2012/0104268 A1 * | 5/2012 | Burr et al. | ................. | 250/370.09 |
| 2014/0021354 A1 * | 1/2014 | Gagnon et al. | ................. | 250/362 |

FOREIGN PATENT DOCUMENTS

| | | |
|---|---|---|
| DE | 102010041805 | 3/2012 |
| WO | 2012028441 | 3/2012 |

OTHER PUBLICATIONS

Thomas Frach et al., The Digital Silicon Photomultiplier—Principle of Operation and Intrinsic Detector Performance, IEEE Nuclear Science Symposium Conference Record, Talk N28-5, 2009, pp. 1959-1965.

(Continued)

*Primary Examiner* — David J Makiya
*Assistant Examiner* — Taeho Jo
(74) *Attorney, Agent, or Firm* — Peter Kendall

(57) ABSTRACT

Systems and methods of generating timing triggers to determine timing resolutions of gamma events for nuclear imaging includes receiving a pulse signature representing a succession of triggers associated with a photomultiplier. When a number of triggers occurring within a predetermined time interval matches a predetermined number, an event trigger can be initiated. A delayed version of the pulse signature can be generated and compared to a predetermined timing trigger level. When the delayed version matches the predetermined timing trigger level, a timing trigger can be generated. Based on the timing trigger level, the timing trigger can be generated at the pulse of the delayed version that corresponds to the first photoelectron of a gamma event. The timing trigger can correspond to a timestamp for the first photoelectron so that a data acquisition system can identify the pulse from which to acquire energy information to generate a nuclear image.

21 Claims, 5 Drawing Sheets

(56) References Cited

OTHER PUBLICATIONS

W. W. Moses, "Time of Flight in PET Revisited", IEEE Transactions on Nuclear Science, vol. 50, No. 2, Oct. 2003, pp. 1325-1330.
Debora Henseler et al.,"SiPM Performance in PET Applications: An Experimental and Theoretical Analysis",IEEE Nuclear Science Symposium Conference Record (2009) N28-1, pp. 1941-1948.
R. Vinke et al.,"Optimizing the timing resolution of SiPM sensors for use in TOF-PET detectors", Nuclear Instruments and Methods in Physics Research A 610 (2009) pp. 188-191.

Yiping Shao, "A new timing model for calculating the intrinsic timing resolution of a scintillator detector",Physics in Medicine and Biology, 52 (2007), pp. 1103-1117.
Dr. York Hämisch, "Fully digital light sensors enabling true photon counting with high temporal and spatial resolution", Image Sensors, London, Mar. 24, 2011, Conference Talk.

\* cited by examiner

SYSTEM AND METHOD OF DETERMINING TIMING TRIGGERS FOR DETECTING GAMMA EVENTS FOR NUCLEAR IMAGING

TECHNICAL FIELD

The present disclosure relates to the field of nuclear medical imaging systems. Particularly, the present disclosure relates to systems and methods of determining timing triggers for detecting gamma events for nuclear imaging.

BACKGROUND

Medical imaging is one of the most useful diagnostic tools available in modern medicine. There are medical imaging processes of many types and for many different purposes, situations, or uses. They commonly share the ability to create an image of a bodily region of a patient, and can do so non-invasively. Examples of some common medical imaging types are nuclear medical (NM) imaging such as positron emission tomography (PET) and single photon emission computed tomography (SPECT), electron-beam X-ray computed tomography (CT), magnetic resonance imaging (MRI), and ultrasound (US). Using these or other imaging types and associated machines, an image or series of images may be captured. Other devices may then be used to process the image in some fashion. Finally, a doctor or technician may read the image in order to provide a diagnosis.

A conventional block detector for identifying gamma events utilizes an array of photomultiplier tubes (PMTs). The array of PMTs identifies a gamma-ray scintillation event (for example, a gamma event) within a pixelated scintillation crystal block by computing the position of the incident gamma-ray from a logical combination of PMT output signals. In conventional timing readout for PET-based systems, wherein coincidence must be detected between a pair of oppositely traveling gamma-rays produced from the annihilation of a positron (that is, the gamma event), the total energy signal from the PMT array is used for signal timing purposes. Recently, silicon photomultipliers (SiPMs) have been implemented as photosensors for reading out the scintillation light of LSO (Lutetium Oxyorthosilicate) and other PET scintillators. In some implementations, the timing resolution has been achieved by coupling each single LSO crystal with typical dimensions of 3×3×20 $mm^3$ to a single sensor pixel which is matched to the 3×3 $mm^2$ light extraction face.

There are two fundamentally different types of SiPMs: the analog SiPM and the digital SiPM. An analog SiPM consists of an array of Geiger-mode avalanche photodiodes (APDs) (or microcells) connected in parallel to form a two terminal device. Then, although the state of the individual microcell can be described digitally as a binary state (ON or OFF), the overall output becomes an analog signal which is roughly proportional to the amount of incident light. Each gamma event leads to a complex signal shape. This shape results from the convolution of the emission characteristics of the scintillator with the temporal response characteristics of the photosensor and front-end electronics.

Typically, leading edge (LE) triggering schemes have given relatively accurate time resolutions for analog SiPMs, especially if the trigger level can be set very low to trigger on the first few photons received from the scintillator emission. However, there are limits to how low the trigger level can be set due to the presence of random dark events of the SiPM microcells and other noise sources. If the trigger level is too low, the dark rate noise can lead to a false trigger. To address this, conventional detectors have incorporated verification schemes, where only those triggers which lead to a minimum pulse height are considered for data acquisition. However, such verification schemes typically lead to detector dead time (that is, the time required for the sensor to perform the verification and for the data acquisition to be ready for the next event). In one conventional sensor, it can take at least twenty (20) nanoseconds until the sensor is ready for the next event, if the trigger is due to a dark pulse and is not verified.

On the other hand, digital SiPMs can measure the trigger time for the first, second, third, etc. avalanche of the photomultiplier to give measured arrival times for the first few measured photons. Typically, the timing resolution for digital SiPMs has been obtained by triggering on the very first avalanche. However, this has the drawback that any random dark pulse will also trigger the acquisition. Similar to the analog SiPMs, a verification scheme is needed to select the true gamma event from the dark pulses.

Thus, conventional photomultiplier sensors and schemes for acquiring data from the conventional photomultiplier sensors suffer from false triggers due to dark events and noise and detector dead time resulting from accounting for such false triggers.

SUMMARY

Therefore, provided are systems and methods of determining a timing trigger for detecting gamma events for nuclear imaging that reduces detector dead time, even in the presence of dark events and noise sources.

In one non-limiting example, a timing trigger for detecting the onset of a gamma event can be determined by receiving a pulse signature representing a succession of triggers associated with a photomultiplier sensor. The triggers can correspond to firing events of microcells of the photomultiplier sensor. When a predetermined number of triggers of the pulse signature occur within a predetermined time interval, an event trigger can be initiated. By determining that a number of triggers match a predetermined number, a true gamma event can be more accurately identified, as the event trigger level can account for and remove dark events (such as false gamma events and noise events) from consideration. A delayed version of the pulse signature can be compared to a predetermined timing trigger level. For example, the predetermined timing trigger level can correspond to a timing interval or a trigger event from which a timestamp should be obtained. The predetermined timing trigger level can also be utilized to identify the pulse from which a data acquisition system should acquire information to generate the nuclear image. For example, where the timing trigger level is an identification of which trigger event to obtain a timestamp (for example, one (1) photoelectron), the detector block can identify which pulse of the delayed pulse signature corresponds to the first photoelectron event. When the delayed version matches a predetermined timing trigger level (for example, when the pulse corresponding to the predetermined trigger level is identified), a timing trigger can be generated. The timing trigger can correspond to a timestamp associated with a pulse of the delayed version of the pulse signature that corresponds to a gamma event. The timing trigger can also identify when a data acquisition system coupled to the photomultiplier and timing trigger circuit should acquire energy information and other data from the pulse signature. The acquired information and data can then be utilized to generate a nuclear image.

Further provided is a timing trigger circuit couplable to a photomultiplier that includes a receiver communicatively coupled to a first comparator and a second comparator, and a timing trigger generator communicatively coupled to the first comparator and the second comparator. The receiver can be configured to receive one or more inputs corresponding to a pulse signature of a photomultiplier. The pulse signature can be input to the first comparator to compare the pulse signature to an event trigger level. When the first comparator determines the pulse signature matches the event trigger level, an output signal from the first comparator can be transmitted to the timing trigger generator. Additionally, a delayed version of the pulse signature can be generated and input to the second comparator. The second comparator can compare the delayed version of the pulse signature to a predetermined timing level. When the second comparator determines the predetermined timing level has been met, a signal can be output from the second comparator to the timing trigger generator. When the signal from the second comparator is input to the timing generator, the timing trigger generator can generate a timing trigger based on the comparisons determined by the first comparator and the second comparator (for example, the output signals output from the first comparator and the second comparator). The timing trigger that is generated can indicate which pulse of the delayed version of the pulse signature corresponds to a gamma event. Based on the timing trigger, a data acquisition system communicatively coupled to the photomultiplier and the timing trigger circuit can determine which timestamp and thus which pulse to acquire information to form or generate the nuclear image.

BRIEF DESCRIPTION OF THE DRAWINGS

The present disclosure will now be described in greater detail in the following by way of example only and with reference to the attached drawings, in which.

DETAILED DESCRIPTION

As required, disclosures herein provide detailed embodiments of the present disclosure; however, the disclosed embodiments are merely examples of the disclosure that may be embodied in various and alternative forms. Therefore, there is no intent that specific structural and functional details should be limiting, but rather the intention is that they provide a basis for the claims and as a representative basis for teaching one skilled in the art to variously employ the present disclosure.

As discussed above, conventional methods for determining timing trigger resolutions of gamma events of detectors such as SiPMs suffer from dark events such as false gamma events due to noise and dark pulses. Conventional methods of determining timing resolutions further suffer from dead time that is needed for a detector to verify that the detected gamma event is a true gamma event or that is needed for the detector to be ready to acquire data corresponding to the next gamma event. The present disclosure provides for robust systems and methods of determining a trigger event to obtain substantially accurate and improved time resolutions associated with the arrival time of a first photoelectron of a gamma event while reducing the effect of dark-pulse rates associated with dark events such as false gamma events and noise events.

Figure 1:
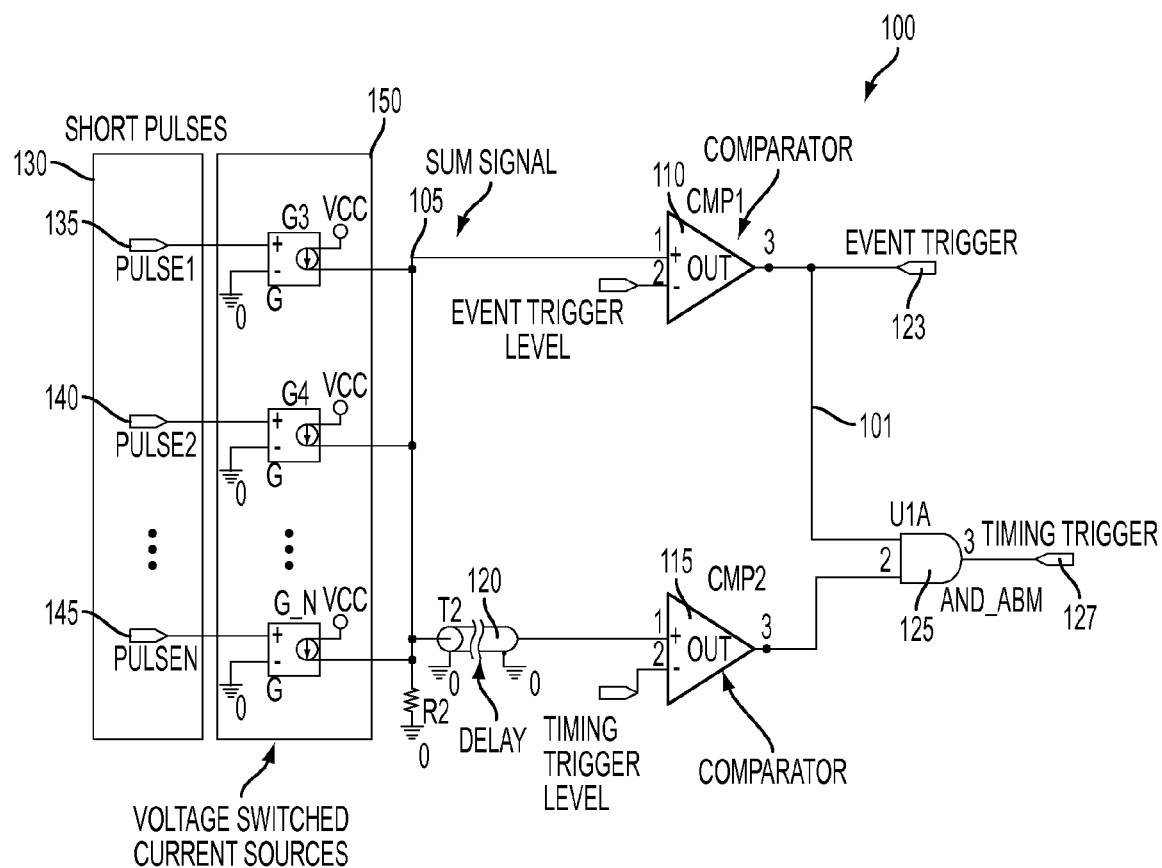
FIG. 1 is a circuit diagram of a detector configured to determine and generate a timing trigger for detecting gamma events of a photomultiplier sensor for nuclear imaging, in accordance with an example implementation in accordance with the invention.

FIG. 1 illustrates a circuit diagram of a detector 100 configured to determine a timing trigger or timing triggers for detecting gamma events producing visible photons emitted by scintillators. The visible photons from the scintillator can produce photoelectrons by the cathode of a photomultiplier tube. The principles of the invention also may be applied to solid-state detectors which convert incident visible photons from the scintillator directly into electric signals. In FIG. 1, the detector 100 can include a timing trigger circuit 101 and a photomultiplier 130. The photomultiplier 130 can be an SiPM or any other photosensor suitable for detecting light from a scintillator to detect nuclear radiation such as gamma rays or photons. In FIG. 1, the photomultiplier 130 can be a digital SiPM, but in other implementations, the photomultiplier 130 can be a hybrid SiPM with analog and digital readouts, or an analog SiPM. The SiPM 130 can include a plurality of microcells 135, 140, 145 that each can transmit a pulse signal or trigger corresponding to a visible photon or a dark event. For example, with a digital SiPM, each of the microcells 135, 140, 145 can output a signal that switches from an OFF to an ON state when a photon pulse or a dark event occurs (such as when an avalanche of a photomultiplier fires or a photoelectron fires). The pulse signal or trigger can be identified as a sharp pulse output from the SiPM. Each of the pulse signals can be provided or transmitted to a voltage-controlled current source 150. The voltage-controlled current source 150 can then transmit the pulse signals to a timing trigger circuit 101. When successive pulses are transmitted by the photomultiplier 130 to the timing trigger circuit 101, the successive pulses can be transmitted as a pulse signature.

In FIG. 1, the timing trigger circuit 101 can include a receiver 105, a first comparator 110, a second comparator 115, a delay block 120, and a timing trigger generator 125 communicatively coupled to the first comparator 110 and the second comparator 115. In one example, the successive pulses can be transmitted to the timing trigger circuit 101 at a plurality of inputs or receivers 105. The timing trigger circuit 101 can sum the successive pulses to form a sum signal corresponding to or representing the total pulse signature of the photomultiplier 135. For example, the timing trigger circuit 101 can sum the successive pulses received over a sub-pixel region, over a whole pixel, over a group of pixels, over a whole detector block (for example, 8×8 pixels to 12×12 pixels), or over any other region of the pixel or pixels of photomultiplier.

When the sum signal is formed, the sum signal can be fed to the first comparator 110. The first comparator 110 can compare the sum signal (that is, the pulse signature) to an event trigger level. As will be discussed in further detail below, the event trigger level can correspond to a predetermined number of trigger events that occur within a predetermined time interval. In particular, the predetermined timing level can correspond to a minimum number of trigger events that need to occur within a predetermined pulse width in order to identify the pulse as a true gamma event. When the first comparator 110 determines the event trigger level is met, an output signal 123 can be transmitted to the timing trigger generator 125, as will be discussed below. The first comparator 110 can also transmit a signal to the delay block 120 to generate a delayed version of the pulse signal.

In response to the first comparator 110 determining the event trigger level is met, the delay block 120 can generate a delayed version of the pulse signature. The delayed version of the pulse signature can be transmitted or fed to the second comparator 115. While FIG. 1 illustrates that the delay block 120 and the second comparator 115 are arranged such that an analog delay is transmitted to the second comparator 115, the delay block 120 and the second comparator 115 can be reversed. That is, a digital delay instead of an analog delay can be fed to the trigger generator 125.

The second comparator 115 can compare the delayed version of the pulse signature to a predetermined timing level. As will be discussed in further detail below, the predetermined timing level can correspond to the level of a single photon pulse or to the level of very few photons. Alternatively, the predetermined timing level can identify which pulse from the successive pulses of the delayed version of the pulse signature should be identified as the first photon from the gamma event. If the predetermined timing level is met, an output signal can be transmitted by the second comparator 115 to the timing trigger generator 125.

The timing trigger generator 125 can be coupled to the first comparator 110 and the second comparator 115 to receive the respective outputs thereof. The timing trigger generator 125 can generate a timing trigger 127 based on the output signal 123 of the first comparator 110 and the output signal of the second comparator 115. The timing trigger 127 generated by the timing trigger generator 125 can indicate which pulses of the pulse signature from the photomultiplier 130 correspond to a gamma event, and thus from which timestamp and pulse to acquire information used to form or generate the nuclear image. For example, the timing trigger 127 can identify when a data acquisition system coupled to the photomultiplier should acquire information from the pulse signature. The acquired information can include a timestamp and corresponding energy information from which nuclear images can be derived.

Although not illustrated in FIG. 1, the timing trigger 127 can be transmitted to a time-to-digital-converter (TDC) to generate a fully digitized timestamp. The predetermined event trigger level (for example, an event trigger) associated with the first comparator 110 can be transmitted to the same time-to-digital-converter (TDC) or another TDC to initiate a processing of the energy information associated with the pulse corresponding to the timing trigger 127. For example, the predetermined event trigger level can initiate an integration of the whole (summed) pulse of the photomultiplier, as opposed to the individual pulses from the microcells, or can read out a digital counter of all fired microcells of the photomultiplier. Based on the fully digitized timestamp and the energy information, a time resolution for the pulse of the photomultiplier can be obtained or determined, and a nuclear image can be generated therefrom.

Figure 2:
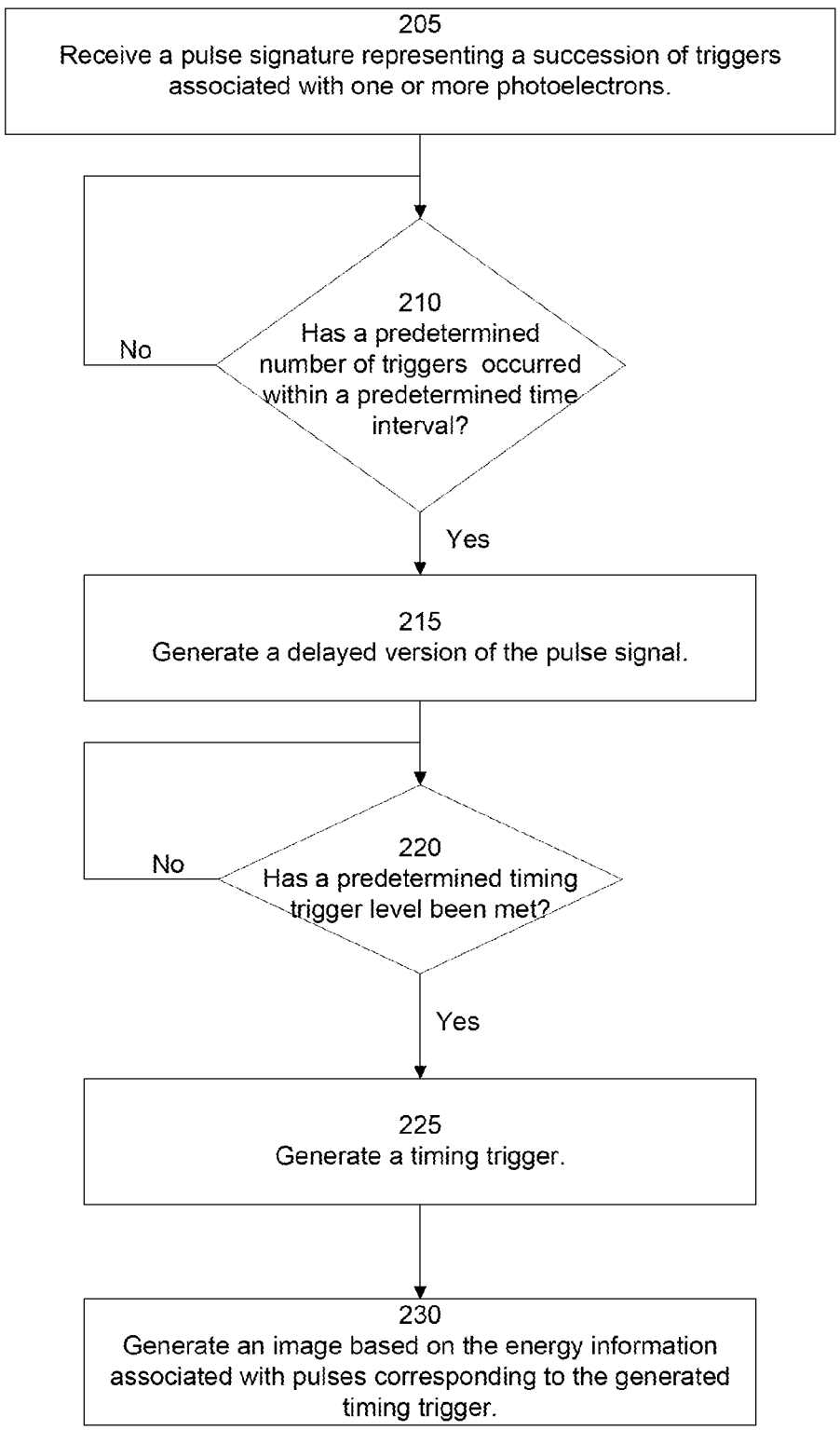
FIG. 2 is a flow chart of an example method of determining a timing trigger for detecting gamma events of a photomultiplier sensor for nuclear imaging, in accordance with an example implementation.

FIG. 2 illustrates a flow chart of an example method of determining a trigger time for detecting gamma events of photomultipliers to generate nuclear images. The method 200 illustrated in FIG. 2 is provided by way of example, as there are a variety of ways to carry out the method. Additionally, while the exemplary method 200 is illustrated with a particular order of steps, those of ordinary skill in the art will appreciate that FIG. 2 and the steps illustrated therein can be executed in any order that accomplishes the technical advantages of the present disclosure and can include fewer or more steps than illustrated.

Each block shown in FIG. 2 represents one or more processes, methods or subroutines, carried out in exemplary method 200. The steps illustrated in FIG. 2 can be implemented in a system including a timing trigger circuit 101 and a photomultiplier 130, such as a SiPM, as illustrated in FIG. 1. Each block shown in FIG. 2 can be carried out by the detector block 100 illustrated in FIG. 1, but in other implementations, each block in FIG. 2 can be carried out by a plurality of detector blocks or a plurality of components of the detector block 100 illustrated in FIG. 1. The flow chart illustrated in FIG. 2 will be described in relation to and make reference to the detector block 100 and the components thereof illustrated in FIG. 1. In the example discussed in the next paragraph, the pulse signature can be transmitted from a digital SiPM to the detector block 100, as illustrated in FIG. 1.

In FIG. 2, the method 200 can begin at block 205. At block 205, a pulse signature representing a succession of triggers associated with one or more single-photon pulses of a photomultiplier can be received by a timing trigger circuit 101. For example, one or more inputs of the timing trigger circuit 101 can be communicatively coupled to a photomultiplier 130 to receive the pulse signature. In an example where the photomultiplier 130 comprises a plurality of microcells 135, 140, 145, the timing trigger circuit 101 can be communicatively coupled to each of the microcells 135, 140, 145 such that signals corresponding to successive trigger events output by the microcells 135, 140, 145, can be received by the timing trigger circuit 101. The trigger events can correspond to individual single-photon pulses of the photomultiplier, firings of each of the photoelectrons, firings of individual microcells 135, 140, 145, or firings output by groups of microcells 135, 140, 145. The trigger events can also correspond to dark events and gamma events that produce a sharp signal output by the photomultiplier 130. In one implementation, the signals corresponding to the trigger events can form a pulse signature.

In one example, each pulse signal of the pulse signature can have a respective reset time. The reset time can correspond to a length of time taken by the respective microcell that outputs the pulse signal to output another pulse signal. If the reset time of a microcell exceeds a predetermined reset time, short pulses can be generated for each pulse signal that has a reset time exceeding the predetermined reset time. For example, a readout circuit, such as a readout application specific integrated circuit (ASIC) can generate the short pulses (shown in FIGS. 4 and 5). In another implementation, if the reset time of one microcell exceeds the predetermined reset time, short pulses can be generated for each pulse signal, including pulse signals that have a reset time less than the predetermined reset time. The predetermined reset time can be 50 picoseconds (ps), 75 ps, 100 ps, 500 ps, or any other reset time that corresponds to a small pulse width or time interval between successive pulse signals. The predetermined reset time can also correspond to a time interval during which several pulses need to arrive together in order to start an event trigger. For example, the reset time can be between 50 ps-500 ps inclusive.

The short pulses generated can then be summed together to form the pulse signature that will be transmitted to the timing trigger circuit 101. For example, the short pulses generated by a readout ASIC can be summed at the input of the timing trigger circuit 101. In other implementations, the short pulses can be summed by a summing circuit, as will be described later in relation to FIG. 6. After the pulse signature is received by the timing trigger circuit 101, the method 200 can proceed to block 210.

At block 210, the pulse signature can be analyzed to determine whether a pulse signature meets an event trigger level. For example, an event trigger level can be a predetermined number of triggers that have occurred within a predetermined time interval. For example, the event trigger level can indicate a number of triggers or single-photon pulses that need to occur within a time interval smaller than the pulse width. Triggers can be identified as a sharp pulse output by the photomultiplier, for example, a digital SiPM. The triggers can correspond to photons from true gamma events or dark events (for example, false gamma events and noise events). In one example, the event trigger level can be 3-8 triggers occurring within 250 ps. In other implementations, the event trigger level can be 4.5 photoelectron events occurring within a 500 ps interval. By identifying that the predetermined number of triggers has occurred within the predetermined time interval, it can be determined that the pulse signature includes one or more significant triggers. That is, if the event trigger level is met, the pulse signals of the pulse signature can indicate that a true gamma event has occurred rather than a dark event. In other words, at block 210, comparing the pulse signature to an event trigger level can identify a predefined significant pulse signature, thereby reducing or eliminating the need for a verification scheme as often found with conventional detector blocks for photomultipliers.

After a determination is made that the event trigger level has been met, an event trigger can be generated. If, however, an event trigger level is not met, an event trigger is not generated, and the method 200 can return to block 210 until an event trigger level is met. When an event trigger is generated, a signal can be output by a first comparator that determined the event trigger level was met. The output signal can notify other components of the timing trigger circuit 101 that a significant trigger, such as a gamma event, has occurred. After the event trigger has been generated, the method 200 can proceed to block 215.

At block 215, a delayed version of the pulse signature can be generated in response to the event trigger. For example, the delayed version can be generated by a delay block 120 of the detector 100. The delayed version of the pulse signature can have a delay time between 100 ps and 1 nanosecond (ns), inclusive. For example, the delayed version can be generated 100 ps after the pulse signature is received from the photomultiplier 130. Thus, the original or first pulse signature received from the photomultiplier 130 can be used to determine an event trigger, and the delayed version of the pulse signature can be generated to determine a timing trigger, as will be described in further detail below. For example, the pulse signature received from the photomultiplier 130 can be utilized to identify which pulse signatures are significant enough (identified by the event trigger level) to continue analyzing for gamma events to generate nuclear images. Then, when a pulse signature is identified as being significant, a delayed version of the pulse signature can be utilized to continue analyzing the pulse signature for trigger times from which to generate nuclear images. In at least one implementation, the delayed version of the pulse signature can only be generated if an event trigger is identified, thereby allowing for a low timing trigger level (that is, a timing trigger level corresponding to a small number of single-photon pulses to identify the time of the event, as will be described in further detail below) as fewer pulse signatures are analyzed, which can reduce an amount of dead time commonly found in conventional detector blocks. After the delayed version of the pulse signature is generated, the method 200 can proceed to block 220.

At block 220, a determination can be made as to whether a timing trigger level has been met by the delayed version of the pulse signature. As discussed above, the timing trigger level can have a critical influence on the accuracy of the trigger time. For example, the timing trigger level can be a predetermined timing level representing the trigger or pulse of the delayed version of the pulse signature to indicate the start of the first single-photon pulse after the event trigger. In one implementation, the timing trigger level can be 0.5 triggers or 0.5 photoelectrons thereby yielding the accurate timing precision of the first microcell firing or first single-photon trigger of the delayed version of the pulse signature. If a pulse exists at the timing trigger level, a determination can be made that the delayed version of the pulse signature matches the timing trigger level. In other implementations, the timing trigger level can be one (1) photoelectron, 1.5 photoelectrons, two (2) photoelectrons, or any other predetermined timing trigger level that provides for high accuracy of obtaining the time stamp of a gamma event. When a timing trigger level is met, the method can proceed to block 225. If a timing trigger level is not met, the method can return to block 220 until a timing trigger level is met. Alternatively, if the timing trigger level is not met, the pulse signal can be discarded and the method can return to block 205.

At block 225, a timing trigger can be generated. For example, a timing trigger generator 125 can produce a timing trigger signal 127 based on the determinations that an event trigger level has been met and that a timing trigger level has been met. When the timing trigger is generated, the data acquisition system can be triggered to acquire data from the pulse of the delayed version of the pulse signature that corresponds to the timing trigger level. For example, when a timing trigger is generated for a timing trigger level of 0.5 photoelectrons, the data acquisition system can be triggered to acquire a timestamp for the pulse of the first single-photon pulse of the delayed version of the pulse signature. Additionally, in response to the timing trigger, the data acquisition system can acquire data corresponding to the energy information associated with the photoelectron corresponding to the acquired timestamp. After the timing trigger is generated and the data acquisition has been triggered to acquire data from the pulse or trigger associated with the timing trigger level, the method 200 can proceed to block 230.

At block 230, a nuclear image based on all data acquired by the data acquisition system in response to timing triggers can be generated. For example, a processor (not shown) coupled to the detector system 100, can compile the data acquired based on the trigger events and reconstruct a nuclear image based on the accumulated event data (such as position coordinates, energy level, etc.). That is, the nuclear image can be generated based on energy and position information associated with pulses corresponding to the generated timing triggers.

Thus, with the example methods of determining and generating a timing trigger to identify a gamma event for generating nuclear images, an event trigger is utilized to efficiently identify which pulse signatures are significant so that the significant pulse signatures are further processed or analyzed to generate a highly accurate timing trigger rather than triggering on the pulse signatures that are identified as insignificant. With the example methods of determining and generating an event trigger to identify a gamma event for generating nuclear images, the insignificant pulse signatures are discarded or withdrawn from further analysis or processing, thereby reducing the amount of dead time typically needed by conventional detector blocks to verify or validate that a detected gamma event is a true gamma event. Additionally, only the pulse signatures which have been identified as matching an event trigger level are further analyzed to obtain the accurate time information associated with the pulse signature, thereby reducing the number of pulse signatures to analyze. As fewer pulse signatures are analyzed or processed to obtain the time stamp, a lower timing trigger level can be utilized, thereby increasing the speed of identifying the timing resolution associated with the gamma event. Whereas, with conventional detectors that utilized low timing trigger levels, larger amounts of dead time occurred, as more pulses or triggers (both significant and insignificant) were analyzed and verified as true or false gamma events before the detector could detect a subsequent pulse or trigger.

Figure 3:
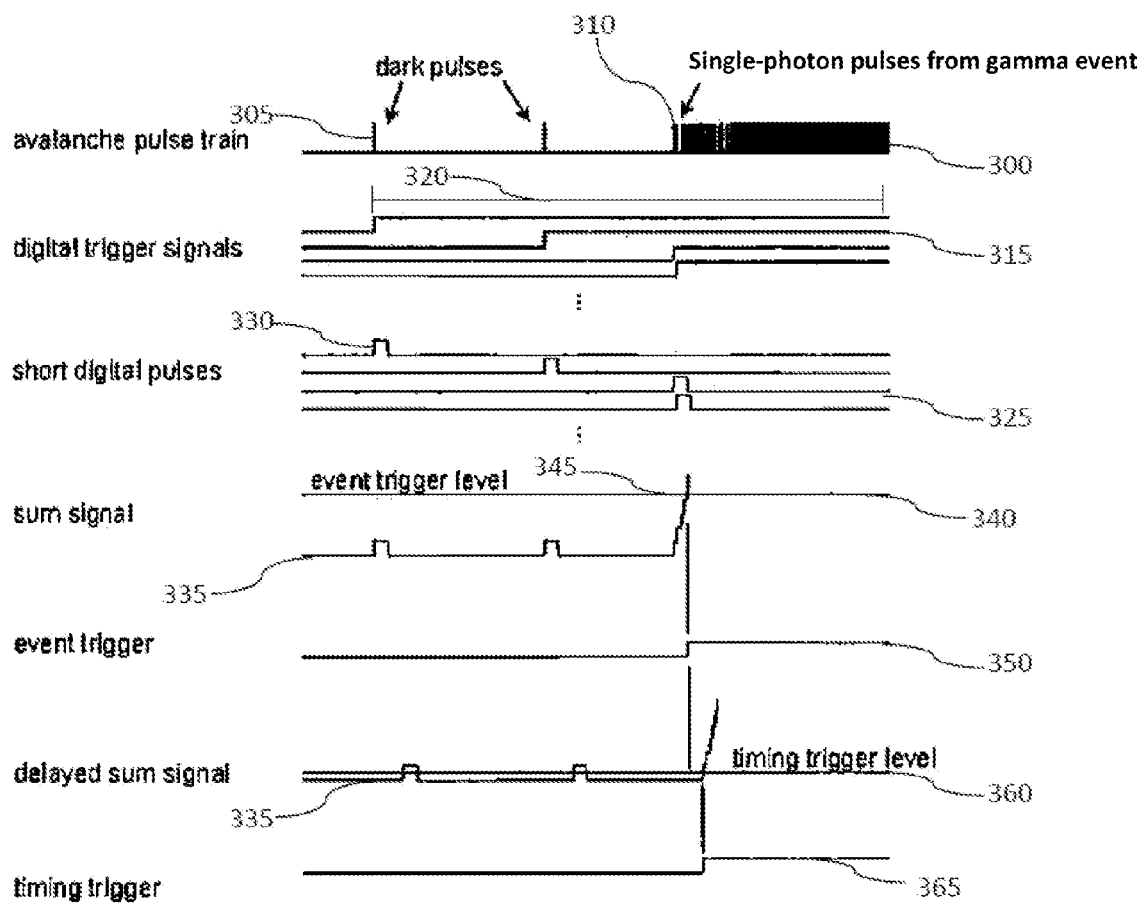
FIG. 3 is a schematic of a pulse sequence illustrating a method of determining a timing trigger for detecting gamma events of a photomultiplier sensor for nuclear imaging, in accordance with an example implementation.

FIG. 3 illustrates a schematic pulse sequence corresponding to a non-limiting example of a method of determining trigger times for detecting gamma events of photomultipliers to generate nuclear images of the present disclosure. FIG. 3 illustrates an avalanche pulse train 300 from which a digital pulse signature can be derived. The avalanche pulse train illustrated in FIG. 3 can represent a sequence of avalanche triggers 305, 310 (such as a representation of a switch from an OFF state to an ON state when an avalanche fires). In FIG. 3, there are a multitude of avalanche triggers represented by pulse spikes in the sequence. The avalanche triggers illustrated in FIG. 3 include two dark event pulses 305 and a plurality of triggers representing single-photon pulses from a gamma event 310, to illustrate the operation of the present invention; obviously a sequence can include any other number of dark event pulses 305 or gamma events 310.

Below the avalanche pulse train 300 is a sequence of digital trigger signals 315 corresponding to the avalanche pulse train. Specifically, in FIG. 3, there are four digital trigger signals which can correspond to four microcells of a photomultiplier or four groups containing microcells of a photomultiplier. The sequence of digital trigger signals 315 can form the pulse signature from which the detector 100 can determine and generate a timing trigger for detecting gamma events of photomultipliers to generate nuclear images. As illustrated in FIG. 3, the pulse widths 320 of the digital trigger signals 315 are wide, as identified by a lack of a representation of an OFF state on the sequence. The sequence of digital trigger signals 315 illustrated in FIG. 3 are trigger signals that have respective reset times that are large or wide. To account for the wide pulse width 320, a readout ASIC 400 (illustrated in FIG. 4) can be implemented to generate a short pulse signature 325 corresponding to the digital trigger signals 315 of the pulse signature. The short pulse signature 325 can be utilized as the pulse signature by the first comparator 110 and the second comparator 115 to determine the trigger times of gamma events from which nuclear events can be derived.

Below the sequence of the digital trigger signals 315 is a sequence of short digital pulses 325 corresponding to the digital trigger signals. As discussed above, the short digital pulses 325 can be generated for a predetermined pulse width 330. In FIG. 3, the predetermined pulse width 330 can be between 50 ps to 500 ps, inclusive. The predetermined pulse width 330 can correspond to the predetermined time interval during which several pulses are needed to arrive together in order to start an event trigger. As illustrated in FIG. 3, the beginning of the pulse widths of the short pulses 325 correspond to the beginning points of the pulses of the digital trigger signals 315. The difference between the short digital pulses 325 and the digital trigger signals 315 in FIG. 3 is that the widths between the ON state to the OFF state for the short digital pulses are shorter or smaller than the widths of the digital trigger signals 315.

As illustrated in FIG. 3, the short digital pulses 325 for each of the microcells are shown. The short digital pulses 325 can be summed to generate a short pulse signature to utilize as the pulse signature from which the event triggers and trigger times for detecting gamma events can be generated. Beneath the short digital pulse sequence is a sum signal 335 representing a sum of the short digital pulses 325. The illustrated sum signal 335 can be fed to or input to the timing trigger circuit 101 illustrated in FIG. 1. For example, the sum signal 335 can be input to the first comparator 110 of the timing trigger circuit 101. The first comparator 110 can compare the short pulse signature 335 to an event trigger level 340. As discussed above, the event trigger level can be a predetermined number of triggers that occur within a predetermined time interval. For example, 2-8 triggers or pulses within 500 ps. In FIG. 3, the first comparator 110 can identify that the short pulse signature 335 meets the event trigger level 340 at time 345, as the short pulse signature 335 includes more than four triggers within 500 ps. Based on this determination by the first comparator 110, an event trigger 350 can be generated, as illustrated in FIG. 3.

The event trigger 350 can be generated to identify when the pulse sum signal 335 met the event trigger level 340. In response to the event trigger 350, a delayed version 355 of the short pulse signature 335 can be compared with a timing trigger level 360 to determine when the delayed version 355 meets the timing trigger level 360, as illustrated in FIG. 3.

In FIG. 3, the second comparator 115 can receive the delayed version 355 of the short pulse signature 335 and compare the delayed version 355 to a timing trigger level 360. The timing trigger level 360 can be a predetermined level. For example, as discussed above, the timing trigger level can be one (1) single-photon pulse or one (1) firing microcell of the photomultiplier. In FIG. 3, the second comparator 115 can determine that the delayed short pulse signature 335 matches the timing trigger level 360 at the first single-photon pulse 310 of a true gamma event. The match between the timing trigger level 360 and the delayed version 355 is illustrated as a point where the timing trigger level 360 and the delayed version 355 cross or meet, as shown in FIG. 3. Based on the match between the timing trigger level 360 and the delayed version 355 of the short pulse signature 335, a timing trigger 365 can be generated.

As discussed above, the timing trigger 365 can indicate when a data acquisition system coupled to the photomultiplier 130 should acquire data to generate a nuclear image, and it determines the high accuracy of the time resolution.

Thus, as illustrated in FIG. 3, the pulse signature 335 can be analyzed to determine if a significant trigger or event trigger has occurred, for example, via a first comparator 110. As pulse signatures are first checked for significant triggers before determining whether a timing trigger level is met, insignificant pulse signatures are discarded, and SiPM detector dead time is reduced. As only the pulse signatures 335 that are considered significant (i.e., which exceed a threshold event trigger level) are transmitted or input to the second comparator 115, a small or low trigger timing level can be utilized to identify or obtain a substantially accurate time resolution associated with the arrival time of the first single-photon pulse corresponding to a true gamma event. Thus, as the proposed systems and methods of determining trigger times for detecting gamma events of photomultipliers to generate nuclear images identify significant pulse signatures using event trigger levels and utilize low timing trigger levels to ensure accurate time resolutions, a robust trigger scheme is provided that reduces the need for: verification or event validation schemes commonly found in conventional photomultiplier detector blocks, controlled single-cell deactivation schemes to account for noise signals, or correction schemes commonly utilized to correct for events where energy losses occur due to Compton scattering.

Figure 4:
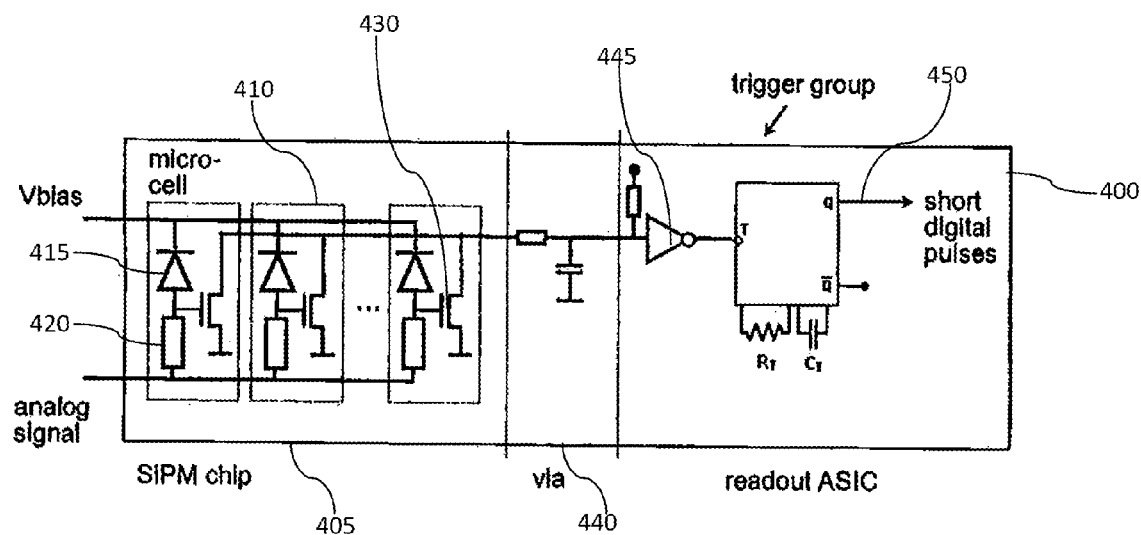
FIG. 4 is a circuit diagram illustrating a photomultiplier connected to a digital readout circuit for generating digital short pulses corresponding to a pulse signature output by the photomultiplier, in accordance with an example implementation.
Figure 5:
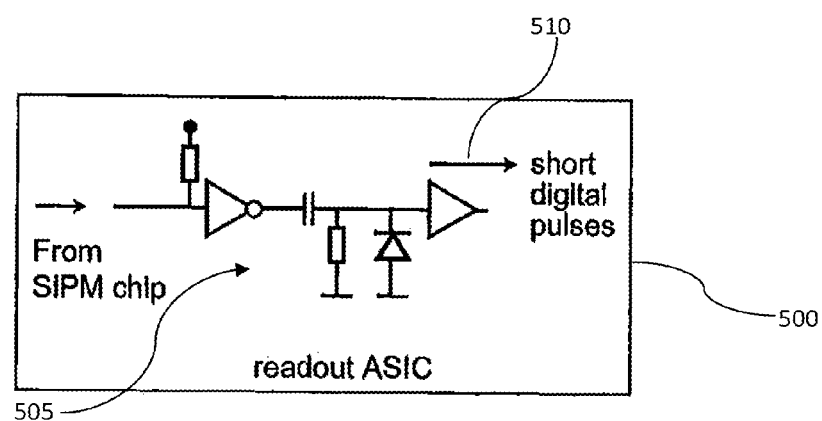
FIG. 5 illustrates an analog readout circuit for generating digital short pulses corresponding to a pulse signature output by the photomultiplier, in accordance with an example implementation.

FIGS. 4 and 5 illustrate example readout ASICs configured to generate short digital pulses from which pulse signatures can be derived for photomultipliers. FIG. 4 illustrates a digital readout ASIC 400. In FIG. 4, the digital readout ASIC 400 is connected to a photomultiplier 405. The photomultiplier 405 in FIG. 4 is a digital SiPM chip but in other implementations can be a hybrid SiPM chip that includes both digital and analog readouts. As illustrated in FIG. 4, the SiPM chip 405 can include a plurality of microcells 410. For example, in FIG. 4, three microcells 410 are illustrated, but in other implementations there can be one microcell, two microcells, or any other number of microcells. Each microcell 410 can include a photodiode 415, such as a reverse biased avalanche diode, or any other diode utilized in photomultipliers for generating nuclear images. The microcell 410 can also include a resistor 420, such as a quench resistor or any other resistor utilized in photomultipliers. The microcell 410 can also include a transistor 430 for deriving the timing signal of the corresponding microcell 410. In FIG. 4, the microcells 410 can be connected to a trigger line in a wired-OR configuration. For example, in FIG. 4, the drain contacts of the microcells 410 are connected, in a wired-OR configuration, to the readout ASIC 400 by a via 440. In FIG. 4, the via 440 can be an RC-combination. Signals output by the microcells 410 are provided to the readout ASIC 400 by the via 440. In FIG. 4, the signals can be provided by the via 440 to a signal amplifier 445 of the readout ASIC 400. The signals can then be processed to generate short digital pulse signals 450 from which a timing trigger circuit 101 (shown in FIG. 1) can determine and generate timing triggers to identify gamma events for generating nuclear images.

FIG. 5 illustrates an analog readout ASIC 500. Similar to FIG. 4, the analog readout ASIC 500 can include a buffer state 505 at which the analog signals from the photomultiplier chip 405 can be processed to generate short digital pulse signals 510. Similar to FIG. 4, the short digital pulse signals 510 generated by the analog readout ASIC 500 can be utilized by the timing trigger circuit 101 (shown in FIG. 1) to determine and generate timing triggers to identify gamma events for generating nuclear images.

Figure 6:
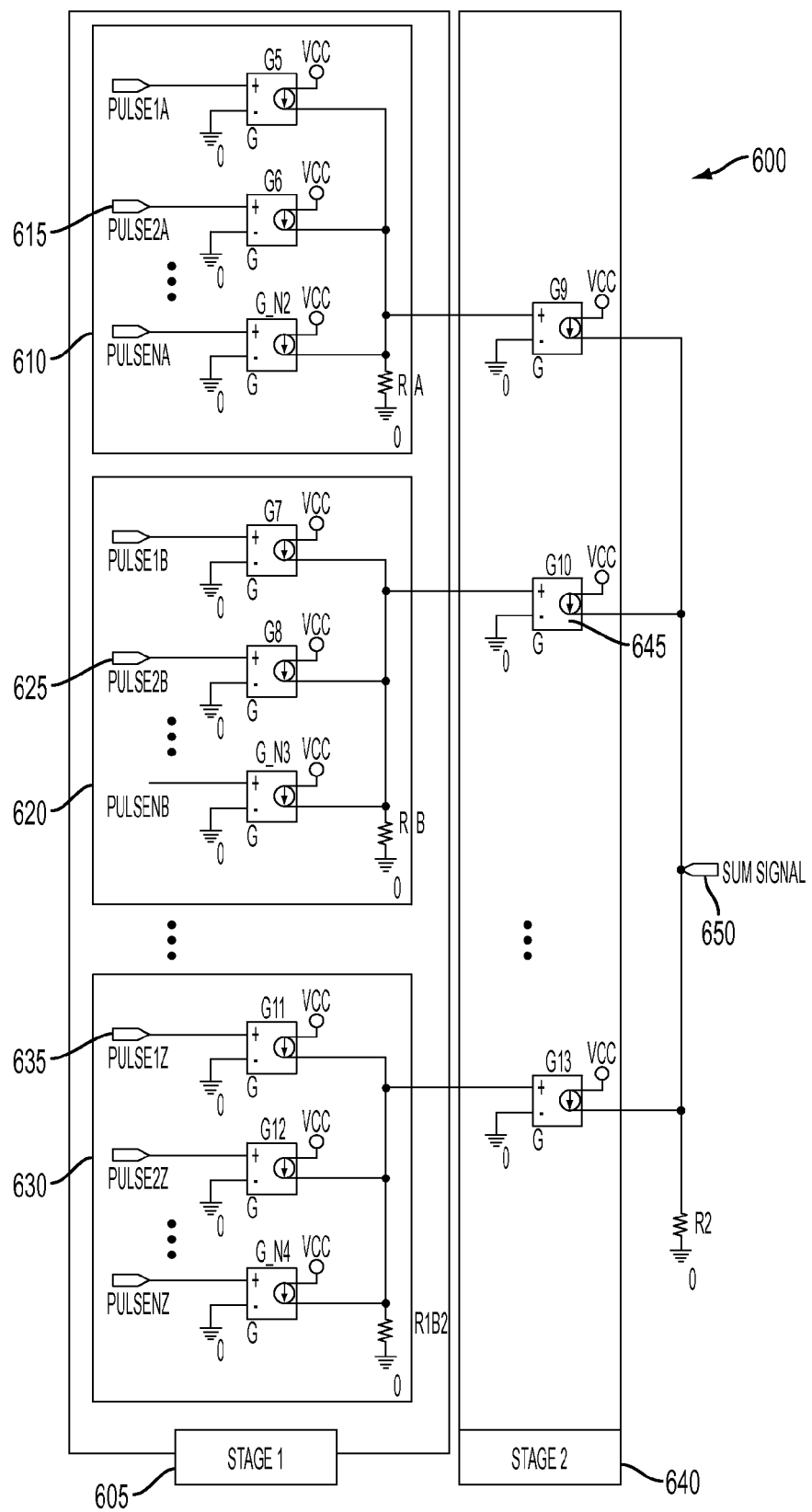
FIG. 6 illustrates a circuit diagram of a summing circuit for connection with a timing trigger circuit for determining a timing trigger for detecting gamma events for nuclear imaging, in accordance with an example implementation.

As discussed above, a photomultiplier can include a plurality of microcells, each having a trigger output. FIG. 6 illustrates such a photomultiplier having a plurality of microcells. In some photomultipliers where there is a plurality of microcells, the microcells can be grouped together such that there is a single output (for example, a trigger group output). Such grouped microcells can be found in hybrid SiPMs. A summing circuit 600 can be utilized for such a photomultiplier that include microcells that are grouped together. In FIG. 6, an example of such a summing circuit 600 is illustrated. In FIG. 6, the summing circuit 600 can be a hierarchical summing circuit 600, but in other implementations, the summing circuit 600 can be any other summing circuit by which the outputs of the trigger groups 610, 620, 630 (that is the outputs of the groups of microcells of the photomultiplier) can be summed to form a sum signal. The resulting sum signal can then be transmitted to or input to a timing trigger circuit 101 (shown in FIG. 1) which can determine and generate timing triggers to identify gamma events for generating nuclear images.

In FIG. 6, the hierarchical summing circuit 600 can include a first stage 605 that includes a plurality of groups 610, 620, 630 of outputs corresponding to groups of microcells of a photomultiplier. Specifically, in FIG. 6, each of the groups 610, 620, 630 have at least three signal inputs 615, 625, 635, but in other implementations, the groups 610, 620, 630 can have any number of signal inputs. The groups 610, 620, 630 can also have different numbers of signal inputs from one another. In FIG. 6, the signal outputs of each group 610, 620, 630 can be summed together to output one signal corresponding to the respective group 610, 620, 630. The output signals corresponding to the groups 610, 620, 630 can then be transmitted to a second stage 640 of the summing circuit 600. In the second stage 640, the output signals of the groups 610, 620, 630 can be input to respective voltage switch circuits 645. The voltage switch circuits 645 can then output respective signals which are summed into a single sum signal 650. This single sum signal 650 can then be input or fed to the timing trigger circuit 101 (illustrated in FIG. 1). More specifically, the sum signal 650 can be fed to the first comparator 110 of the timing trigger circuit 101 to determine whether an event trigger level has been met, as described above.

While the above disclosure illustrates using the same summed output signal for the event trigger and the timing trigger, those of ordinary skill in the art will appreciate that a wired-OR combination of short pulses can be utilized as an input to the delay block 120 and the timing trigger comparator (for example, the second comparator 115). That is, rather than input the sum signal to both the event trigger comparator (for example, the first comparator 110) and the timing trigger comparator (for example, the second comparator 115), the sum signal can be input to the event trigger comparator, and the short pulses from which the sum signal was generated can be input to the delay block 120, and thus the timing trigger comparator.

Additionally, the granularity of the summing or the OR-combination for the event trigger and the timing trigger can be different. For example, the sum of all the trigger groups in a pixel (for example, as illustrated in FIG. 6) can be utilized for the event trigger comparator. The OR-combination of a larger group of pixels could be utilized for the timing trigger comparator. In such an implementation, the event trigger outputs of all the pixels in the timing trigger can be combined in an OR-combination together, and the result of this OR-combination can be used as an event trigger for the pixel group. Other levels of granularity with event triggers at sub-pixel level or pixel-group levels can also be utilized. The granularity of the timing trigger can be higher or lower than for the event trigger.

As discussed above, the presently disclosed systems and methods of determining and generating timing triggers to identify gamma events for generating nuclear images provides a way to achieve substantially accurate time resolutions associated with the arrival time of a first photoelectron associated with a true gamma event, without being sensitive to the typical level of detector dark-pulse rates commonly found in conventional photomultipliers and detector blocks. The combination of a high event trigger level and a low timing trigger level for a delayed version of a pulse signal signature allows for a robust triggering scheme for acquiring data from the photomultiplier, thereby minimizing the effects of dark count rates associated with dark events. The present disclosure further reduces the need for an event validation or event verification to verify that a gamma event is a true gamma event after an initial trigger by utilizing a high event trigger, which also reduces dead time typically associated with such validation and verification. Additionally, utilizing a high event trigger reduces the need for a noisy cell deactivation scheme, which further reduces detector dead time. That is, the high event trigger level identifies pulse signal signatures that are significant (for example, those that correspond to true gamma events), which can reduce dead time that detectors typically undergo when resetting themselves to detect a next trigger or a next photoelectron event. As discussed above, as fewer pulse signatures are analyzed for timing levels, a lower trigger timing level can be utilized, which results in a higher likelihood that an accurate timing resolution corresponding to a gamma event can be obtained or determined. In other words, the presently disclosed systems and methods of determining and generating timing triggers to identify gamma events for generating nuclear images provides for an efficient and accurate consideration of trigger or photoelectron events that represent gamma events from which nuclear images are generated.

Systems and methods of determining and generating timing triggers to identify gamma events for generating nuclear images have been thus described. It will be apparent to those skilled in the art that the same may be varied in many ways without departing from scope of the present disclosure. Any and such modifications are intended to be covered within the scope of the following claims.

What is claimed is:

1. A method of generating timing triggers to determine timing resolutions of gamma events for nuclear imaging, the method comprising: receiving a pulse signature representing a sum of pulses each produced in response to an incident photon from a scintillation detector; comparing the pulse signature to a predetermined threshold event trigger level; generating an event trigger signal when it is determined that the pulse signature exceeds the threshold event trigger level; generating a delayed version of the pulse signature; comparing the delayed version of the pulse signature to a predetermined timing trigger level; generating a timing trigger level signal when it is determined that the delayed pulse signature exceeds the predetermined timing trigger level; and generating an event timing trigger identifying timing of the pulse signature that corresponds to a gamma event, in response to the generation of both said event trigger signal and said timing trigger level signal wherein said event trigger signal level is higher than said timing trigger level signal.

2. The method of claim 1, wherein the delayed version of the pulse signature is generated after a predetermined delay time from receiving the pulse signature.

3. The method of claim 2, wherein the predetermined delay time is between 100 picoseconds (ps) and 1 nanosecond (ns).

4. The method of claim 1, wherein the predetermined threshold event trigger level corresponds to at least three pulses produced within a predetermined time interval.

5. The method of claim 4, wherein the predetermined time interval is between 50 ps and 500 ps.

6. The method of claim 1, wherein the predetermined timing trigger level is 0.5 single-photon pulses.

7. The method of claim 1, wherein a pulse corresponds to a firing event of a photon in a photomultiplier.

8. The method of claim 1, wherein said event timing trigger is used to trigger a data acquisition system to acquire event data from said scintillation detector.

9. The method of claim 1, wherein each pulse is associated with a reset time, and wherein the method further comprises:
when the reset time for a respective pulse of the succession of pulses exceeds a predetermined reset level, generating short pulses corresponding to the succession of pulses for the predetermined time interval;
summing the short pulses; and
setting the summed short pulses as the pulse signature.

10. A timing trigger circuit for generating timing triggers to determine timing resolutions of gamma events for nuclear imaging, the timing trigger circuit comprising: a receiver configured to receive a pulse signature representing a sum of pulses each produced in response to an incident photon from a scintillation detector; a first comparator configured to compare the pulse signature to a predetermined threshold event trigger level, and to generate an event trigger signal when it is determined that the pulse signature exceeds the threshold event trigger level; a delay component configured to generate a delayed version of the pulse signature; a second comparator configured to compare the delayed version of the pulse signature to a predetermined timing trigger level, and to generate a timing trigger level signal when it is determined that the delayed pulse signature exceeds the predetermined timing trigger level; and an event timing trigger generator configured to generate an event timing trigger identifying timing of the pulse signature that corresponds to a gamma event, in response to the generation of both said event trigger signal and said timing trigger level signal, wherein said event trigger signal level is higher than said timing trigger level signal.

11. The timing trigger circuit of claim 10, wherein the delay component generates the delayed version of the pulse signature after a predetermined delay time from receiving the pulse signature.

12. The timing trigger circuit of claim 11, wherein the predetermined delay time is between 100 picoseconds (ps) and 1 nanosecond (ns).

13. The timing trigger circuit of claim 10, wherein the predetermined threshold event trigger level corresponds to at least three pulses produced within a predetermined time interval.

14. The timing trigger circuit of claim 13, wherein the predetermined time interval is between 50 ps and 500 ps.

15. The timing trigger circuit of claim 10, wherein the predetermined timing trigger level is 0.5 single-photon pulses.

16. The timing trigger circuit of claim 10, wherein a pulse corresponds to a firing event of a photon in a photomultiplier.

17. A PET imaging apparatus comprising a timing trigger circuit as set forth in claim 16 and including said photomultiplier, wherein said photomultiplier is one of a digital silicon photomultiplier (digital SiPM) or a hybrid silicon photomultiplier (hybrid SiPM).

18. The PET imaging apparatus of claim 17, wherein:
the photomultiplier comprises a plurality of microcells, each microcell having a corresponding reset time; and
the system further comprises a readout circuit coupled to the photomultiplier and the timing trigger circuit, the readout circuit configured to generate short pulses corresponding to the triggers of the pulse signature when the corresponding reset times of the microcells exceed a predetermined reset time, the short pulses forming the input received by the timing trigger circuit.

19. The PET imaging apparatus of claim 18, wherein the readout circuit is one of a digital circuit or an analog circuit.

20. The timing trigger circuit of claim 10, wherein said event timing trigger is used to trigger a data acquisition system to acquire event data from said scintillation detector.

21. The timing trigger circuit of claim 10, wherein each pulse is associated with a reset time, and wherein:
when the reset time for a respective pulse of the succession of pulses exceeds a predetermined reset level, short pulses are generated corresponding to the succession of pulses for the predetermined time interval;
the short pulses are summed; and
the summed short pulses are set as the pulse signature.

* * * * *